United States Patent [19]

Swinehart

[11] 4,341,654
[45] Jul. 27, 1982

[54] GETTER FOR MELT-GROWN SCINTILLATOR INGOT

[75] Inventor: Carl F. Swinehart, University Heights, Ohio

[73] Assignee: The Harshaw Chemical Company, Cleveland, Ohio

[21] Appl. No.: 241,566

[22] Filed: Mar. 9, 1981

Related U.S. Application Data

[62] Division of Ser. No. 931,323, Aug. 7, 1978, Pat. No. 4,277,303.

[51] Int. Cl.³ ............................................... C09K 11/12
[52] U.S. Cl. ............................. 252/301.4 H; 156/605
[58] Field of Search ................... 252/301.4 H, 181.1; 250/483; 156/605, 617 R, 617 SP; 423/264, 275

[56] References Cited

U.S. PATENT DOCUMENTS

| | | | |
|---|---|---|---|
| Re. 30,156 | 11/1979 | Brinckmann | 252/301.4 H |
| 2,149,076 | 2/1939 | Stockbarger | 156/616 |
| 2,640,755 | 6/1953 | Hay | 423/499 |
| 2,984,626 | 5/1961 | Lefever | 156/616 |
| 3,933,970 | 1/1976 | Rosette et al. | 264/319 |
| 3,969,491 | 7/1976 | Pastor et al. | 423/299 |
| 4,030,965 | 6/1977 | Hammond et al. | 423/299 |
| 4,050,905 | 9/1977 | Swinehart | 156/605 |
| 4,055,457 | 10/1977 | Swinehart | 156/616 R |
| 4,076,574 | 2/1978 | Pastor et al. | 423/499 |
| 4,277,303 | 7/1981 | Swinehart | 156/605 |

Primary Examiner—O. R. Vertiz
Assistant Examiner—Margaret B. Medley
Attorney, Agent, or Firm—Alfred D. Lobo; James A. Lucas

[57] ABSTRACT

The addition of a getter consisting essentially of reactive oxides of boron and silicon, to a melt of an alkali metal halide serves to overcome problems of unacceptable color, afterglow and hardness attributable to trace impurities present in the melt. These trace impurities are generally metals present in a concentration less than 1 part per million (ppm) parts of melt. An ingot melt-grown from charge stock treated with the getter provides high quality optical bodies such as light pipes, laser windows and scintillators. Specific problems characteristic of a scintillator ingot grown from a highly purified alkali metal halide "remelt", such as is obtained by crushing and melting portions of a melt-grown ingot, are overcome by adding to the remelt a portion of fresh powder stock in which the getter has been uniformly distributed.

A process is taught for the Stockbarger growth of a scintillator ingot from a charge stock treated to include a getter consisting essentially of the combined reactive oxides of boron and silicon, comprising superheating a melt of treated charge stock for a period of time sufficient to react at least some of the reactive oxides with deleterious trace impurities present in the melt, and growing a scintillator ingot free from discoloration, afterglow or undue hardness due to the presence of the impurities.

6 Claims, No Drawings

GETTER FOR MELT-GROWN SCINTILLATOR INGOT

This is a division of application Ser. No. 931,323, filed Aug. 7, 1978, now U.S. Pat. No. 4,277,303.

BACKGROUND OF THE INVENTION

It is well known that melt grown ingots such as are used in the production of commercially acceptable optical bodies, must pass the most stringent quality control requirements. In fact, the continuing demand for better performance of optical bodies requires that ingots be grown as nearly perfectly as possible. Since impurities in the melt generally degrade performance as an optical body, it is essential that growth stock for a melt-grown ingot be as pure as possible. By this is meant that deleterious impurities in crystal stock be less than 1 part per million (ppm). Even so, it often happens that stock which passes the most stringent purity specification still unpredictably yields an ingot which is unacceptable from the standpoint of color, afterglow or hardness.

By "unacceptable color" we refer to the photosensitivity of an ingot as evidenced by solarization. By "solarization" we refer to darkening of the crystal when it is exposed to light. Crystals which resist solarization are deemed to have acceptable color, that is a water-white color. In fact, an ingot may be removed from the crucible in which it is grown, and appear to have perfectly acceptable color, yet, after it is exposed to ultraviolet light for a short period of time, the ingot is visibly darkened. Such darkening of an ingot, though it may fade in time at room temperature, indicates the presence of impurities which may be present in so small a concentration as to be undetectable by any of the conventional analytical means, whether chemical or physical. An ingot with a color problem is scrapped. Since the cost of scrapping even a relatively small ingot is substantial, it is unnecessary to state that one does everything possible to avoid the cost of scrapping an ingot in excess of 20 inches in diameter, which costs can easily exceed several tens of thousands of dollars.

By "unacceptable afterglow" we refer to a scintillation phosphor ("scintillator") which upon excitation produces light pulses over a period substantially more than 10 microsecs, at a level of intensity which interferes with the measurement of light output of subsequent pulses. A low quality scintillator may exhibit an afterglow for many seconds, and even minutes.

By "unacceptable hardness" we refer to a noticeable increase in hardness of the clear portion of the ingot, due for example, to the distribution of calcium impurity, which makes a difference in the type of surface finish which may be imparted the usable portion of the ingot. The type of finish alters the reflectance of a sanded, machined or burnished (say, with steel wool), surface of scintillator units fabricated from the ingot.

This invention does not purport to permit the substitution of relatively impure charge stock for the high-purity charge stock required in the growth of scintillator ingots, but it does provide a solution to the aforedescribed problems which unexpectedly arise even when high-purity or ultra-pure stock is used. A typical charge stock for a melt-grown ingot may be commercially available crystals of ultra-purity, or stock obtained by purification of commercially available, less pure material, as described for example in U.S. Pat. No. 2,640,755 to J. Hay. Such virgin crystalline charge stock typically used for growing ingots, is referred to as "fresh powder stock". Charge stock may also constitute scrap obtained from cutting useful scintillators from an acceptable ingot. Such scrap, after inspection to reject pieces having visible inclusions of foreign material, is referred to as "remelt scrap" and is generally charged, after it is crushed, to a crucible. In some cases, large pieces of remelt scrap can be stacked in the crucible provided their shape does not allow the charge to shift during melt-down.

As is well known, the use of getters or scavengers in the growth of melt-grown ingots involves a mechanism particularly noted for its unpredictability. Typically, a getter is used to remove a specific impurity known to be present in a particular melt-grown ingot. For example, a trace of free bromine in the atmosphere above a melt of an alkali metal chloride or alkali metal bromide, is disclosed in U.S. Pat. No. 4,055,457. The bromine serves to suppress sulfate, nitrate and nitrite ions. In another example, potassium chloride ingots are grown in the presence of carbon tetrachloride in the atmosphere, with $CCl_4$ at growth temperature provides phosgene to scavenge oxygen (see Pastor, R. C. and Braunstein, M., Air Force Weapons Laboratory Report AFWL-TR-72-152, Vol. II, p. 103–108, July 1973).

As is also well-known, scintillator ingots are grown in fused silica crucibles, particularly when water is excluded by an inert gas sweep, as taught by Lafever, R. A. in U.S. Pat. No. 2,984,626. It is possible that the melt is inadvertently contaminated with silica if the temperature of the melt is high enough, and/or the charge contains an impurity that is alkaline, or generates a basic reaction. Whether or not this silica contaminant is deemed active, there is no evidence of the extent, if any, of such possibly beneficial contamination. Ingots grown in fused silica crucibles from pure growth stock, in the absence of moisture and with an inert gas sweep, are indistinguishable from those grown from the same charge stock in platinum crucibles, all other conditions of growth being the same.

We have previously used silica ($SiO_2$) alone in a reactive form, as a useful getter for a melt from which a scintillator ingot is grown. However, silica alone, in an amount in the range from about 10 ppm to about 100 ppm, produces an undesirably high amount of "floc". This cotton-like floc is unavoidably retained as inclusions in scintillator units fabricated from the ingot. More importantly, the use of active $SiO_2$ alone requires a relatively high "soak temperature" at which the melt is superheated during the period before crystal growth to make the $SiO_2$ react with the deleterious trace impurities, and also to melt silicates (disilicates) formed by the reaction with active silica alone. The soak temperature is generally greater than 100° C. above the melting point of the charge stock. With addition of reactive oxides of boron (hereafter "borate" for brevity), the soak temperature is generally less than about 200° C., and preferably less than about 100° C. above the melting point of the charge stock. Borate addition, by itself, in the absence of active silica, shows no appreciable change in performance or reduction in sensitivity.

Minor variations in a method of growing an ingot often result in a substantially different optical body, whether it be for the better or for the worse. At the very low concentrations of impurities which prove to be deleterious, contamination from the furnace becomes a surprisingly important factor when growing an ingot from ultra-high purity stock. Heretofore, improvements in ingot quality were sought by minor alterations in the conditions of growth, and/or a beneficial, if unpredictable, stratification of the ingot in such a way as to concentrate the impurities in a portion of the ingot which can be discarded. However, where concentration of deleterious impurities is so low as to be undetectable by conventional chemical or spectrographic means, it is most difficult to concentrate the impurity in any particular portion of the ingot, or to trace its origin. In other words, an effective getter must remove the effects of the deleterious impurities no matter what their origin or how they are distributed in the ingot, which requires that the getter be able to combat the effects of a wide range of contaminants.

Briefly stated, when metal or non-metal trace impurities are distributed throughout a melt, an effective getter must: (1) be dispersed throughout the melt, and essentially homogeneously distributed for Stockbarger growth where melt-stirring is minimal; (2) react with the impurities present without removing too much of a dopant or activator deliberately added to the melt; (3) tie up the reaction products in such a way as not to affect the optical performance of the finished ingot; and yet (4) have characteristics such that the presence of the getter in the melt-grown ingot is not objectionable. These many exacting requirements are satisfied to our knowledge, only by the combination of reactive oxides of boron and silicon, (thus, referred to as a "combination getter"), or a compound which yields one or the other, or both, of the desired reactive oxides. The oxides of titanium, aluminum, zirconium, lanthanum, gallium, tin, lead and other members of Groups III and IV of the Periodic Table, are ineffective getters, if not deleterious contaminants, in an alkali metal halide melt.

A melt-grown alkali metal halide ingot grown according to the process of this invention in which a combined getter of borate and active silica has been used, has most of the floc formed by reaction of the getter with impurities in the melt, distributed near either the upper surface of the ingot for some melts, or the bottom surface for other melts; and, some floc distributed around the sides of the ingot. Most of the floc is rejected by the melt, before or during growth of the ingot, in such a way that the portions of the ingot containing most of the floc can be discarded. The floc within the melt is characteristically present therein as metal silicate and metal borate solid particles or liquid droplets which tend to cluster or agglomerate. Excess unreacted silica is insoluble in alkali metal halide melts, and collects along with the metal borosilicate floc. This floc tests high in boron and various metals not found in analysis of the growth stock, but the floc may or may not contain all of the added borate component of the getter, some of the borate ends up in solid solution in the crystal when the procedure described herein is followed. Such an ingot, grown from a treated melt, fails to exhibit visible darkening upon exposure to ultraviolet light in an amount which would darken an otherwise identical ingot which was not grown from a melt which was treated (hence referred to herein as "treated melt" or "treated ingot"), with the combination getter.

SUMMARY OF THE INVENTION

It has been discovered that objectionable color, afterglow and hardness in a melt grown scintillator ingot may be overcome by the addition of a combination of getter components consisting essentially of reactive oxides of boron ("borate" for brevity), and silicon. Borate is exemplified by boric acid, or other compound with a B—O bond, such as sodium tetraborate, sodium fluoborate, and the like, which compound is at least slightly soluble in the melt, and which also yields a reactive boron oxide when the melt is superheated or "heat-soaked".

It has been discovered that high quality laser windows may be produced from a monovalent metal halide melt, and particularly an alkali halide melt. These windows have a high breakdown threshold to radiation-induced damage greater than 6 $J/cm^2$. Breakdown threshold is the damage caused by a high-power pulsed laser.

It is therefore a general object of this invention to provide an ultrapure charge stock from which a high-quality alkali metal halide ingot may be meltgrown, which charge stock is treated to include from about 5 ppm to about 1000 ppm of an active $SiO_2$ component, and from about 5 ppm to about 1000 ppm of a borate component, computed as $BO_2^-$, which together comprise a combination two component getter.

It is also a general object of this invention to provide a process for growing a high-quality alkali metal halide ingot from a charge stock treated with the aforementioned combination getter, comprising heat-soaking the melt at a temperature in the range from about 10° C. to about 150° C. above the melting point of the charge stock, for a period of time sufficient to react at least some of each component with deleterious impurities and particularly, metal impurities in the melt. Typically deleterious impurities are present in the melt in trace amounts sufficient to yield an optical body with objectionable color, afterglow and hardness, which are characteristics when no getter is added.

It has also been discovered that a melt-grown scintillator ingot having objectionable color, afterglow and hardness, may be remelted and regrown, if a portion by weight of "remelt" is combined with a portion of fresh powder stock to which is added a combination getter of borate and silica. An ingot grown from the remelt and fresh powder stock mixed with getter has been found to be purged of objectionable characteristics of an ingot grown from remelt alone, or re-melt from re-melt combined with fresh powder stock which has not been treated with the combination getter.

It is also a specific object of this invention to provide a process for melt-growing an ingot according to the Stockbarger method, from a charge stock containing a major amount of remelt scrap, and a minor amount of fresh powder stock, or vice versa, by deliberately adding to the crystalline charge stock, a combination getter consisting of slightly melt-soluble borate and insoluble but active silica distributed throughout the charge stock, and superheating the melt prior to commencing growth, to a temperature lower than about 200° C. above the melting point of the charge stock, for a period of time sufficient to allow reaction of the combination getter with impurities present in the stock or derived from furnace components, for example, from the nickel alloys used in heating elements, or from crucible supports, and the like.

It is another specific object of this invention to provide a process for growing an activated alkali metal halide scintillator characterized by reproducible water-white clarity and a freedom from undue hardness, objectionable afterglow or discoloration when exposed to ultraviolet radiation, and which is further characterized by excellent resolution.

It is a more specific object of this invention to provide a water-white sodium iodide:thallium (NaI:Tl) ingot having characteristic metaborate ion absorption bands at about 5 and 17 microns, or a series of unresolved band groups near 7, 8 and 13.5 microns for borates or polyborates containing B—O—B bridge bonds, or both, resulting from a melt having a combination borate and active silica getter added thereto in an amount from about 5 ppm to about 1000 ppm borate, computed as $BO_2^-$, and from about 5 ppm to about 1000 ppm silica, computed as $SiO_2$, which getter reacts with deleterious metal impurities, present in the melt in an amount less than 1 ppm. Such impurities commonly present are nickel, lead, iron, manganese and silver, none of which is present, by itself, in an amount greater than 1 ppm of melt.

It is a further specific object of this invention to provide a process for melt-growing an undoped alkali metal halide light pipe, or low temperature scintillator ingot of ultrapurity. Such an ingot, for example, of sodium iodide free of traces of thallium, is an excellent scintillator at or below about dry ice temperature, and at room temperature is characterized by very low relative pulse height, so it is used as a light pipe to shield a NaI(Tl) crystal from gamma rays emitted by the phototube.

Yet a further discovery incident to the use of the aforementioned combination getter in a melt-grown alkali metal halide, is that the getter reacts to form silicates and borates of deleterious impurities which may include Group II A elements including alkali earth metals such as calcium, strontium and barium, Group II B elements such as zinc, Group IIIA elements such as aluminum and thallium, Group III B elements such as the rare earth elements, elements of Group IV B such as zirconium, Elements of Group V B such as vanadium, elements of Group VI B such as chromium, elements of Group VII B such as manganese, and elements of Group VIII particularly iron and nickel, the presence of one or more of which, though not all related to the problems of afterglow and discoloration, are likely to produce undue hardness.

It is therefore also a specific object of this invention to provide a process for growing an acceptable water-white scintillator ingot characterized by a freedom from objectionable hardness, whether grown by Stockbarger or Kyropoulous methods.

These and other objects, features and advantages of the process of this invention, and the ingot formed by using the afore-identified combination getter will become apparent to those skilled in the art from the following description of preferred forms thereof and the examples set forth herein.

DETAILED DESCRIPTION OF THE PREFERRED EMBODIMENTS OF THE INVENTION

As hereinabove stated, this invention is directed to the use of a combination getter in a melt of an alkali metal halide which is contaminated with trace quantities of undesirable metal and non-metal impurities. Discoloration is most unwanted in scintillation phosphors such as are used in scintillator detectors. By "scintillation phosphors" we refer to those phosphors which have very short decay times less than about 10 and preferably less than about 2 microseconds. The performance of these phosphors is measured by the phosphors' capability to resolve a preselected monoenergetic gamma ray near room temperature.

Those skilled in the art will recognize that color is not necessarily detrimental to the performance of all optical bodies, but that color formation by the passage of light in a scintillation phosphor adversely affects the resolution of the crystal. This is critical in large crystals where the path length, from point of emission to the detector, is long and variable for different points of origin within the crystal. Scintillation phosphors of commercial significance are those which exhibit good resolution at room temperature or above, though scintillators which perform best below dry ice temperature have especialized application, for example, as light pipes used at room temperature. Therefore, further detailed description of this invention will be specifically directed to a scintillation phosphor which is melt grown from an alkali metal halide, and still more particularly, to an ingot grown from an alkali metal halide which has been activated by the addition of an activator or dopant. Most preferred scintillators are sodium iodide doped with thallium iodide (Na:Tl), cesium iodide doped with thallium iodide (Cs:Tl), potassium iodide doped with thallium iodide (KI:Tl), cesium iodide doped with sodium iodide (CsI:NaI), and thallium chloride doped with iodides of (i) thallium, (ii) thallium and beryllium, or (iv) other combinations of activator iodides, all of which are referred to herein as (TlCl:metal iodides).

The level of doping (activator concentration) required for an alkali metal halide scintillator depends upon the particular use of the scintillator. Factors affecting the choice of activator for a scintillator and the concentration of the activator, are well known to those skilled in the art. In general, the level of activator is less than about 10 mole percent, and more preferably is in the range from about 1 ppm by weight, to about 1% of the melt, so as to give a uniform enough response while obtaining acceptable resolution. As is well recognized by those skilled in the art, the concentration of activator in the charge to the crucible is generally in excess of that required for activation of the melt-grown ingot. In the present invention, using the combination getter, the concentration of activator is present in an amount sufficiently in excess of that required for scintillation, to permit depletion of the activator by reaction with the getter.

It is essential to recognize that the borate component of the getter is provided in a form in which a B—O bond of the compound can react with impurities in the melt, and the silica component is provided in a melt-insoluble, but reactive form. It is immaterial whether each component of the getter is added to the charge stock crystals separately, or together. It is also immaterial whether the components are added as finely divided solids or in liquid form, though it will be apparent that it is more convenient and accurate to add low concentrations of each component as a liquid. For example, boric acid may be added to hot charge stock crystals as an aqueous solution which of course will cause water to be evaporated immediately upon contact. Alternatively, a solid, finely divided alkali metal borate or metaboric acid may be sprinkled onto the charge stock crystals. Any "borate" which is dispersible in the charge stock crystals, and which provides a reactive B—O bond will serve as a getter to complement the getter action of active silica. Such a compound is the essential borate component of the combined getter, and is also referred to herein as a reactive borate.

The silica component of the getter is preferably added with the borate to the charge stock crystals in either liquid or solid form. For example, silicic acid may be added as an aqueous solution, water from which will be vaporized upon contact with hot charge stock. Alternatively, an ingot may be grown in a crucible which has been previously coated with ethylsilicate and then ignited to deposit insoluble but reactive $SiO_2$ on the walls of the crucible. Or, silicic acid available as Cabosil* from Cabot Chemical Co. may be used to coat powder crystals uniformly, and thereafter, the silicic acid may be heated to convert the silicic acid to silica. In other words, whatever the manner in which the silica component is introduced into the melt, it is essential that it be present in the melt in its insoluble form, but capable of reacting with metal impurities to form insoluble silicates.

Despite the demand for ultra-pure growth stock for the production of alkali metal halide phosphors, growth stock sometimes inadvertently contains insoluble $SiO_2$ as an impurity. The presence of this impurity is generally less than about 1 ppm, though on occasion, stock with silica impurity approaching 2 ppm has been used. The presence of such a low concentration of silica impurity can be detected only with great difficulty by searching for and finding small inclusions of floc within the crystal. We are unaware of any growth stock for scintillator ingots which might have been fortuitously sufficiently contaminated with both the silica component and the borate component, each in appropriate concentration, so as to produce a scintillator ingot free of discoloration, undue hardness or afterglow.

An alkali metal halide charge stock, and particularly the halides of lithium, sodium, potassium and cesium, of this invention is one which typically contains certain impurities but is treated with the combination getter. Such impurities commonly are aluminum, calcium, magnesium, lead, and potassium (because of $K^{40}$ content), albeit in low concentration, each less than about 1 ppm of charge stock. Even lower amounts, less than about 0.5 ppm of copper and iron may also be present. With the combination getter, acceptable crystals may be cut from ingots grown from charge stock contaminated with relatively high levels of the foregoing impurities, which charge stock would not otherwise yield acceptable crystals. These relatively high levels which may be tolerated are set forth in a typical analysis of charge stock of this invention in Table I hereinbelow, under the heading "Max. ppm", corresponding approximately to levels detected by emission spectroscopy which are listed under the heading "Max emission spec level".

TABLE I

| Component | Typical cone (ppm) | Max emission spec level | Max ppm |
|---|---|---|---|
| Al | less than 1 | FT⁻(faint trace minus) | 5 |
| Ca | less than 1 | VFT(very faint trace) | 2 |
| Mg | less than 0.5 | VFT⁻(v faint trace minus) | 1.5 |
| Cu | less than 0.5 | EFT⁻(ex faint trace minus) | 0.5 |
| Fe | less than 0.5 | EFT⁺(ex faint trace plus) | 1.0 |
| Pb | about 0.015 | | 0.04 |
| K | less than 0.5 | | 1.2 |
| SiO₂ | 13 | 9 ppm (min) | 17. |
| H₃BO₃ | 10 | 6 ppm (min) | 14. |

The following impurities may sometimes be present, but are usually present in a concentration so low as not to be detectable by emission spectroscopy: arsenic, bismuth, beryllium, cadmium, cerium, chromium, cobalt, gallium, germanium, indium, sodium, nickel, molybdenum, silver, strontium, titanium, tungsten, vanadium, zinc, and zirconium.

In general, about equal parts by weight of the borate and silicic acid are thoroughly mixed together, and uniformly dispersed throughout the crystals of charge stock in a crucible in which a Stockbarger ingot is to be grown. It is preferred to use less than 1000 ppm of each component, computed on the basis of active $SiO_2$ and $BO_2^-$, though there is no particular upper limit as long as the excess is rejected from the ingot. It is most preferred to use from about 10 ppm to about 50 ppm of each component. The ratio of the borate and silica components may be varied depending upon the sensitivity of the melt to superheating. The more borate component in the getter, the lower is the temperature at which the getter is reactive. The charge stock crystals carrying the combination getter on their surfaces are melted and then gradually superheated. By superheating we refer to the step of heating the molten contents of a crucible to a temperature less than about 200° C. above, and preferably in the range from about 50° C. to about 100° C. above the melting point of the alkali metal halide for a period of time in the range from about 30 minutes to about 15 hours depending in some measure on the size of the ingot.

Those skilled in the art will recognize that it is desirable to avoid thermal stirring set up by convection currents in a Stockbarger melt. The higher the superheating temperature the greater the thermal stirring effect, so it is desirable to have a low superheating temperature, for as short a period as possible, without overloading the melt with the borate component of the getter.

Though it will be apparent that sufficient combination getter is desirably added to react with all the impurities responsible for objectionable color, afterglow and hardness in a crystal, excessive addition of the getter must be avoided. A too-large excess may not be rejected sufficiently to one or the other extremities of an ingot, which extremities can be conveniently discarded. An amount of either component in excess of about 200 ppm of melt is excessive and generally results in the formation of floc within the crystal which interferes with the performance of the crystal particularly when it is used as a camera plate. Such accumulations of floc might lead to a mistaken diagnosis when a scintillation phosphor is used for a camera plate, as for example, in an Anger camera used for the detection of tumors.

Though the presence of from about 10 ppm to about 50 ppm of silica and borate, each, might counter the color problem in fresh powder stock, the presence of the same, or even a larger amount of residual borate or silica in remelt scrap shows no beneficial effect, because both excess residual silica and borate in remelt scrap are in an inactive form. Addition of combination getter to remelt scrap alone improves the quality of an ingot grown, but the ingot is not quite as good as that of an ingot grown from remelt scrap containing a major portion by weight of fresh powder stock, or from fresh powder stock alone. Thus, though remelt stock is purer than fresh powder stock, it is preferably used in conjunction with a major amount of fresh stock to which silica and borate have been deliberately added, and uniformly distributed.

In a particular embodiment this invention is of particular value for melt-growing an ingot from high purity sodium iodide fresh powder stock crystals which contain trace color-forming metals such as nickel, lead, iron, manganese, silver and the like, or impurities which interact with thallium activator to increase the afterglow of the melt-grown ingot and increase the tendency of the ingot to solarize.

By using charge stock treated with the combination getter, the process of this invention permits the Stockbarger growth of a large ingot in which unwanted impurities are rejected towards the upper and lower portions of the ingot, and also to its sides. Thus only a minimal portion of the ingot is discarded. The result is that a nearly "full-size" ingot is recovered. In other words, very little of the ingot must be discarded. Because impurities which affect resolution have been removed, the acceptable ingot characteristically has predictable performance. Minimum labor is then expended temporarily to mount and test portions of the ingot for different surface preparations to attain a specified resolution for each portion. It will be apparent that impurities which harden the crystal will make it more difficult to prepare the surface. Less apparent is that, because the impurities which normally harden the ingot have been removed, the ingot can be press-forged or extruded with less difficulty than that encountered with a prior art ingot.

An alkali metal halide ingot grown from treated charge stock characteristically has metaborate absorption bands at about 5 and 17 microns, or a series of unresolved band groups near 7, 8 and 13.5 microns for borates or polyborates containing B—O—B bridge bonds, or all the absorption bands. The presence of these absorption bands in the crystal correlates with low afterglow for 3600 Å light, and indicates that the crystal was treated with the combination getter. The correlation is not proportional, but an absorption of at least 10% per inch (or 0.04 cm$^{-1}$) at about 5 microns is a "fingerprint" characteristic of a treated ingot which exhibits low afterglow. This fingerprint also indicates that the crystal was obtained from an ingot grown from a treated melt which was heat-soaked at an appropriate, not-too-high heat soak temperature.

If the heat soak temperature is too high, that is greater than about 150° C. over the melting point of the charge stock, the absorption at 5.15 microns for $BO_2^-$ is about 1% per inch, or less. Typically, such an ingot which is over-heat-soaked has marginally acceptable afterglow, but satisfactory photosensitivty and hardness.

The following Example 1 illustrates a typical procedure for melt-growing a conventional 10 inch NaI(Tl) ingot in a Stockbarger furnace from a charge of ultra-pure fresh powder stock, utilizing the method generally described in U.S. Pat. No. 2,149,076 the disclosure of which, modified to obtain a controlled atmosphere, is incorporated herein. This modification comprises (1) evacuating the furnace and charge, and (2) admitting an inert atmosphere to control evaporation during growth.

EXAMPLE 1

39.7 kg of fresh powder sodium iodide stock is loaded into a 10" diameter platinum crucible and 80 g of thallium iodide crystals are added to it. The crucible is loaded into a Stockbarger furnace for growth using a slow elevator speed. The ingot is melted out of the crucible and annealed. It showed excellent color and very few accumulations of floc. However, when the ingot was exposed to a 30 watt ultra-violet lamp, emitting a 3600 Angstrom wavelength, for a period of one minute, the ingot darkened visibly. This indication of darkening is indicative of an unacceptable ingot.

It is noted that the ingot has objectionable hardness evidenced by the quick dulling of cutting tools used to dress and section the ingot. This objectionable hardness was also evidenced when a portion of the ingot was press-forged into a polycrystalline body at a temperature below its melting point and sufficient pressure to effect the crystalline transformation as described more fully in U.S. Pat. No. 4,063,255. The press-forging was unsatisfactory.

A sodium iodide:thallium (NaI(Tl)) scintillator ingot was melt-grown as detailed in the following Example 2, utilizing a combination getter, using Stockbarger-type growth. It will be recognized that, though it may be less desirable because of the precautions necessitated, a NaI(Tl) ingot, with the combination getter deliberately added to the melt, may be grown by Kyropoulos growth.

EXAMPLE 2

39.7 kg of fresh powder stock sodium iodide crystals was weighed into a large mixing vessel heated to keep the crystals at a temperature above about 80° C., and preferably at a temperature in the range from about 120° C. to about 150° C.

A solution of 2.46 g $Na_2SiO_3.9H_2O$ and 0.4 g $H_3BO_3$ in 100 ml water is acidified with 50% HI and sprayed onto the crystals which are heated above a temperature which will allow $NaI.2H_2O$ to form. The crystals containing about 10 ppm $H_3BO_3$ and 13 ppm $SiO_2$ are placed in a 10 inch platinum crucible along with 80 g TlI crystals. An ingot is then grown in a Stockbarger furnace under an atmosphere of nitrogen.

After melt-down the melt is given a heat soak at elevated temperature, that is, superheated gradually until the melt in the cone of the crucible is about 100° C. above the melting point. The period of heat soaking is about 4 hr from the time the charge is melted until the temperature is set down for growth of the ingot. The ingot grown is melted out and annealed. It has excellent color and remaided water white after exposure for one minute to the ultra-violet light used in the previous example. It is free from objectionable afterglow and hardness. It is easily cut without dulling the cutting tools and it is press-forged under the same conditions which failed to produce a press-forged optical body in Example 1 hereinabove.

The ingot melt-grown from a treated melt displays narrow bands at about 5 and 17 microns for metaborate ions identified as disclosed in J. Appl. Phys. Supp. 33 (1) 364–366, 1962 by Morgan H. W. and Staats, P. A; or, a series of unresolved band groups near 7, 8 and 13.5 microns for borates containing B—O—B bridge bonds, comparable to modifications of absorptions found in the vapor of $H_2B_2O_3$, as disclosed in Inorg. Chem. 8(4) 731–7, 1969 by Grimm, F. A. and Porter, R. F.; and sometimes, the ingot displays both the narrow bands and the unresolved band groups. The unresolved band groups are attributable to polyborates which include condensed borates, $B_4O_7^{-2}$, fluorooxyborates $B_4F_{12}O^{-2}$, as well as polymetaborate $(BO_2)_n^{-n}$ rings of variable length.

The infrared spectra for a crystal from near the cone of the ingot showed a series of very narrow bands for $BO_2^-$ ions at 3.23, 3.26, 3.43, 5.01, 5.18, 5.21, 6.58, 6.77, 16.7, 17.4 and 20.1 microns. The strongest band is at 5.18 microns being 21% per inch of crystal. Crystal from near the heel of the ingot showed the 5.18 microns bands at 30% per inch, and also showed bands for unresolved groups for $(BO_2)_n{}^{-n}$ as follows: group I—6.78, 6.83, 7.0, 7.18; group II—7.87, 7.92, 8.05, 8.42; group III—13.9, 14.2; group IV—9.3; group V—10.5; group VI—18-20; group VII—5.78; and, group VIII—6.13, 6.36. Group I was the strongest showing an absorption of 17.5% per inch of crystal.

EXAMPLE 3

The previous Examples 1 and 2 utilized fresh stock powder and no scrap crystals. In this example 20 kg of scrap crystals of sodium iodide thallium, after visual inspection for discontinuous, visible inclusions and a wash of the surfaces, were dried and crushed for remelting and charged to a 10" diameter platinum crucible. To this charge was added 20 kg of fresh stock powder sodium iodide crystals containing about 20 ppm $H_3BO_3$ and 20 ppm $SiO_2$ added in the same way as in the previous example, namely by spraying an acidified aqueous solution of $H_3BO_3$ and silicic acid on the heated crystals. 70 g thallium iodide crystals are placed in the crucible with the NaI crystals. The charge was melted down in the platinum crucible under approximately one atmosphere of nitrogen, superheated in a manner identical with that described in Example 2 hereinabove, and melt-grown under one atmosphere of nitrogen. The ingot was melted out from the crucible and annealed. It showed excellent water-white clarity. The ingot was exposed to the 30 watt UV fluorescent lamp for a period of one minute, as were the ingots grown in Examples 1 and 2 hereinbefore. No visible darkening of the ingot was observed. This indicated that the scintillator had acceptable color, and that the unacceptable color characteristic of an ingot grown from too-pure remelt scrap had been effectively controlled.

EXAMPLE 4

In a manner analogous to that described hereinabove in Example 3, 50 percent remelt scrap crystals was used in which floc accumulations of silica were present. Fresh stock powder was added in an amount of about 50 percent by weight, except that no silica was added with the fresh stock. The ingot which was given a heat soak as in Examples 2 and 3 hereinabove, was melt-grown in the Stockbarger furnace. The ingot showed good color when removed from the annealing furnace at room temperature, but visibly darkened when exposed to the UV lamp for a period of one minute. This indicated that prior existing silica in remelt scrap is present in a form which is not active, that is, will not react to form metal impurity silicates, and therefore is ineffective to provide the necessary getter action to counteract the color problem in the scrap.

EXAMPLE 5

A sodium iodide melt-grown ingot is grown, in a furnace in which no thallium doped crystal has been grown. Commercially available, pure sodium iodide fresh stock powder is used having less than 0.5 ppm potassium, no measurable thallium impurity, and to which 10 ppm $H_3BO_3$ and 15 ppm $SiO_2$, measured as $SiO_2$, is added. The melt was given a heat soak, that is, superheated for 2 hrs at 735° C. The melt-grown ingot, after annealing, showed excellent water white color. Exposure to the UV lamp for a period of one minute produced no visible darkening of the ingot. Samples 1" diameter ×1" high from the ingot, have a relative pulse height (RPH) at room temperature of less than 1% of NaI(Tl) where a soda-lime glass window is used. Crystals from the same furnace, with the same fresh powder stock and with no combination getter added, show RPH in the range from about 1.5% to about 2% of NaI(Tl). This difference allows the low energy sensitivity of an instrument to be improved from 0.03 MEV down to 0.015 MEV when the grown crystal is used as a light pipe for a NaI(Tl) scintillator. In this application Tl as low as 0.02 ppm contributes to pulse height, along with other elements such as tin, indium, cadmium, etc. which may be present at very low concentrations, and which nevertheless contribute to pulse height. Even such trace impurities can be removed by the combination getter of borate and silica. The crystal shows from about 10% to about 40% per inch, absorption, at 5.15 microns for $BO_2{}^-$ ions in solid solution, which indicates than a melt-soluble borate was present. However, these absorptions do not detract from the use of a crystal as a light pipe for light emitted from a NaI(Tl) scintillator.

EXAMPLE 6

A 2¼ inch diameter platinum crucible is loaded with 520 g of pure cesium iodide and 2.25 g of sodium iodide (0.75 mole percent of added sodium iodide) into which about 15 parts $HBO_2$ and 20 parts Cabosil* active $SiO_2$ per million parts CsI were blended as a dry mixture in a dry room. The crucible is placed into a controlled atmosphere, Stockbarger type furnace having upper and lower chambers with an opening therebetween and an elevator for supporting the crucible, and operable to move the crucible between the chambers. The crucible is mounted on the elevator with the lower extremity of the crucible at the opening between chambers and extending into the upper chamber.

The furnace is evacuated at room temperature to a pressure of one-half micron. It is then heated to a temperature of 200° C. and held at this temperature for a period of 13 hours during which time the evacuation by vacuum pump is continued and the pressure reduced to one-tenth micron at the end of this period. The temperature of the furnace is then raised to 400° C. and maintained at this temperature for 2$\frac{3}{4}$ hours during which time a pressure of one-tenth micron is maintained. At the end of this period, the furnace is filled with helium gas to a pressure of one atmosphere and the furnace temperature raised to 750° C. at the control thermocouple and maintained for 6 hours, melting the charge in the crucible. The contents of the entire crucible are then superheated, the temperature near the top of the melt being about 850° C., and near the bottom about 750° C. The temperature of the upper chamber is then lowered to 700° C. and maintained while the temperature of the lower chamber is maintained at 460° C. The crucible is then lowered by the elevator at a rate of 1.4 millimeter per hour. After a growing time of approximately 50 hours, the crystal is removed from the furnace and melted out of the crucible by heating the crucible to the melting point of the crystal material for a brief period. The crystal is then annealed by lowering its temperature to room temperature at a rate of approximately 25° C. per hour. A crystal so prepared is water-white, that is free of color, and has better performance because thallium impurity is reduced to less than 1 ppm. The ingot exhibited pulse heights of 93% of NaI(Tl) and resolution of 8.8% when excited by gamma radiation from a cesium 137 source.

EXAMPLE 7

A paltinum crucible in which an ingot has been grown by a conventional Kyropoulos procedure, is allowed to cool until the surface of the melt begins to solidify. Then 20 kg of fresh powder stock NaI crystals and 60 g of TlI crystals are distributed over the surface of the solidified surface of the melt. A mixture of 0.4 g Cabosil* silica and 0.28 g metaboric acid powder is sprinkled into the charge. The temperature is then gradually increased and the charge stock crystals with silica and borate getter are stirred into the melt. The melt is held at about 50° C. above its melting point for about 2 hours, or until the melt clarifies. Superheating in the range from about 10° C. to about 100° C. is generally effective, and a temperature in excess of 150° C. above the melting point of the charge is to be avoided. Floc formed by reaction of the combination getter with impurities in the melt, is rejected by the melt and moves to the walls of the crucible where most of the floc is caught. When the melt clarifies, it indicates that the temperature may be dropped, and the seed lowered into the melt to commence growth in the conventional manner. A boule grown from treated melt is remarkably free from afterglow, unacceptable color and hardness.

I now refer to a laser window produced from a sodium chloride or potassium chloride ingot melt-grown from charge stock treated with the combination getter. A laser window so produced may be cut from a large ingot, and therefore is essentially a single crystal; or, the window may be produced by press-forging the ingot to form a polycrystalline optically integral window, as described in U.S. Pat. No. 3,933,970, the disclosure of which is incorporated by reference thereto as if fully set forth herein. When such a laser window is subjected to a pulsed laser of high enough power, the window is cracked or otherwise damaged. Those skilled in the art will appreciate that a high breakdown threshold in a window may be more desirable than higher strength and lower absorption in a similar window with a lower breakdown threshold.

Testing of laser windows for breakdown thresholds when the windows are subjected to 10.6 micron nanosecond pulses, is described in "Radiation-Induced Damage to Polycrystalline KCl and NaCl by 10.6 m Nanosecond Pulses," by Reichelt, W. H. and Stark, E. E.; AFCRL-TR-74-0085 (111), Special Report No. 174, Los Alamos Scientific Laboratory, New Mexico. Prior art laser windows grown from alkali metal halides, and particularly sodium chloride, sodium iodide, potassium chloride and cesium iodide, had breakdown thresholds lower than 6 J/cm$^2$, whether the window was essentially single crystal or not (that is, polycrystalline). Laser windows produced from ingots grown as described in the following example 8, from a charge stock treated with the combination getter exhibit breakdown thresholds greater than 6 J/cm$^2$.

EXAMPLE 8

Sodium chloride crystals, purified as described in U.S. Pat. No. 2,640,755, while still damp with mother liquor, are blended with enough metso sodium matasilicate solution previously acidified with muriatic acid, to add about 130 parts per million parts by weight (ppm) SiO$_2$ equivalent. The crystals are then dried, sampled and analyzed for silica content batch by batch.

50 kg of this analyzed growth stock which averages from about 110 to about 120 ppm SiO$_2$, are slowly charged into a 14" (in) platinum crucible while adding dropwise 16 ml of boric acid solution containing 1.0 g H$_3$BO$_3$ so as to distribute 20 ppm H$_3$BO$_3$ in the charge.

The crucible is loaded into a Stockbarger type furnace and heated to an elevated temperature 115° C. above the temperature control setting which is known to allow solid to form in the conical tip of a salt ingot of the same size previously grown in the same furnace. This elevated soak temperature is held for 12 hr, then the control is lowered 115° C. After growth of an ingot, the crucible is removed and annealed to bring the crystal ingot to room temperature intact.

This ingot 14" diameter by 7" high showed no haze or color in a Tyndall beam of light and a very low level of scatter from inclusions on component boundaries. All of the silica and most of the borate settled into the cone or adhered to the crucible wall so it did not adversely affect the yield of usable crystal.

Transmission spectra show imfrared absorptions for polyborate in clear samples from this ingot. These bands fall in three groups making broad bands with multiple peaks. Group I: 6.88, 7.0, 7,1, 7.2 microns; Group II: 7.86, 8.08, 8.23 microns; Group III: 13.28, 13.47, 13.73, 13.9 microns. For this ingot, the strongest absorption was in Group I, giving an absorption coefficient $\beta = 0.0085$ cm$^{-1}$ in the cone and 0.194 cm$^{-1}$ in the heel for $(BO_2)_n{}^{-n}$. The cone also had 0.008 cm$^{-1}$ at 5.02 microns for $BO_2{}^-$.

Since this crystal was intended for use in the infrared rather than in the UV and visible (as in previous examples) the borate in solid solution was held down by using a long soak and minimal scavenging with H$_3$BO$_3$. Thus the borate absorptions did not restrict use of the crystal for 10.6 microns laser windows. These borate absorptions would not permit use of the crystal for infrared spectrometer optics. Polished samples 1.5" diameter by 0.4" thick were measured for total absorption using a CO$_2$ laser calorimeter. Here the coefficient $\beta$ was 0.0010 cm$^{-1}$ in the cone and 0.0020 cm$^{-1}$ in the heel. This compared favorably with 0.0013 cm$^{-1}$ which is the median value for routine testing of cone samples of NaCl ingots to which no borate was added.

The ingot was cut into slabs for laser windows and, two pieces 3" diameter by 1.09 cm thick, were given a commercial laser window polish. Samples from high and low in the ingot were tested at several places for radiation induced damage by nanosecond pulses of 10.6 micron energy, followed by transmission spectra to show the amount of polyborate absorption.

Damage appeared at 7.28±0.93 J/cm$^2$ in the sample with 0.021 cm$^{-1}$ polyborate absorption and 8.20±0.15 J/cm$^2$ for the sample closer to the heel where the polyborate absorption was 0.051 cm$^{-1}$.

These breakdown threshold values are 40 to 80% better than those for NaCl crystal made from the same quality growth stock having active silica scavenger but without any borate addition. Prior art NaCl crystals test 4.5 to 5 J/cm$^2$. From theoretical considerations the improvement is thought to result from a reduction in multivalent cation impurity.

Measurement of borate absorption (usually BO$_2{}^-$ at 5.02 micron) in prior art NaCl ingots to which no borate was added, show occasional absorption at very low levels (less than 0.001 cm$^{-1}$) and detectable in fewer than one in ten ingots. This accidental presence of boron impurity is not enough to modify the silicate and provide a combination getter action to remove multivalent cations from a melted halide of a monovalent metal.

In the treatment of monovalent metal halide charge stocks described above, most of the borate goes into the insoluble silica-silicate floc where it can be found by analysis. Also the infrared spectra between 8 and 15 microns for these floc inclusions is altered. Instead of broad bands for $Si_2O_5^=$, $Si_4O_9^=$, $SiO_2$, etc., the addition of borate breaks each silicate band into a series without a basic shift in wavelength. Even though phase data indicates $Na_2Si_2O_5$ and $SiO_2$ as solid phases for the system $Na_2O$—$SiO_2$—$B_2O_3$, from X-ray and melting points this infrared spectral change points to incorporation of borate in the silicate structure. Such a change in molecular structure and exposed groups for chains and rings could account for the improved getter action of borate-silicate over silicate alone and why it requires more than accidental trace boron impurity to modify the amount of silica required. Since the solubility of $SiO_2$ in these melts is virtually zero the scavenger action requires transfer of multivalent cations from the melt into the dispersed solid silicate or borate-silicate. This requires a substantial surface area of silica and sets its minimum amount that is, in excess of 5 ppm, for operating within a practical time interval.

Chemically and physically the action of this borate-silicate getter is the same for all monovalent metal halide salts. In an analogous manner to that described for NaCl, other optical bodies of AgCl, AgBr, LiF, NaBr, NaF, KCl, KBr. KI, CsBr, CsI, RbCl, RbBr, TlCl, KRS-5, and KRS-6 (see "Handbook of Electronic Materials" by Moses, A. J., Vol 1, p 90, IFI-Plenum Publishing Company, New York, N.Y. 1971) may be prepared for applications in which the borate absorptions of the body are not detrimental. In particular, a prior art silver chloride crystal used to record and define the path of high energy particles may now be improved. Such a prior art silver chloride crystal is well-known to be affected by impurities which heretofore have eluded analysis.

I claim:

1. A scintillator crystal having a characteristic resistance to visible darkening when exposed for a period of one minute to a 30 watt ultraviolet lamp emitting predominantly 3600 Å wavelength radiation, said crystal consisting essentially of an alkali metal halide, optionally activated with an effective amount of an activator to exhibit scintillation, and having distributed therein from about 5 parts to about 1000 parts per million by weight (ppm) of melt, of each component of a combination getter consisting essentially of reactive oxides of boron as one component, and an insoluble but active silicon dioxide as the other component, at least some of each component being present as a reaction product with said melt, and said ingot exhibiting borate absorption in its transmission spectrum.

2. The crystal of claim 1 wherein said borate absorption occurs as narrow bands at about 5 and 17 microns for mataborate ions, and/or a series of unresolved bands at about 7, 8 and 13.5 microns for borates containing B—O—B bridge bonds, said absorption being present in excess of 5 percent per inch for either said bands.

3. A scintillator ingot grown from an alkali halide melt in a furnace by the Stockbarger method wherein, prior to commencing growth of said ingot, charge stock crystals are contacted with a combination getter consisting essentially of reactive oxides of boron and silicon, each in an amount in the range from about 5 parts to about 1000 parts per million parts by weight of said crystals, thereafter said crystals are melted in a cone-bottom crucible, and the melt superheated for a period of time sufficient to react at least some of said oxides with trace impurities in said melt to form reaction products with said impurities, and to reject said reaction products as floc near the surfaces of said ingot, so that said ingot exhibits a characteristic resistance to visible darkening when exposed for a period of one minute to a 30 watt ultraviolet lamp emitting predominantly 3600 Å wavelength radiation, and essentially no unacceptable afterglow.

4. A melt-grown ingot produced from a melt of a halide of a monovalent metal by addition to said melt of more than 5 ppm by weight of said melt, of each component of a combination getter consisting essentially of at least a slightly slightly melt-soluble reactive oxide of boron as one component, and an insoluble but active silicon dioxide as the other component, and superheating said melt for a period of time sufficient to react at least some of each component with trace impurities present in said melt.

5. The melt-grown ingot of claim 4 wherein said halide is selected from the group consisting of chloride and iodide, and said monovalent metal is selected from the group consisting of sodium, potassium, and cesium.

6. The melt-grown ingot of claim 5 wherein said melt is silver chloride.

* * * * *